US012573458B2

(12) United States Patent
Peng et al.

(10) Patent No.: US 12,573,458 B2
(45) Date of Patent: Mar. 10, 2026

(54) METHOD FOR FORMING SEMICONDUCTOR STRUCTURE WITH WAVE SHAPED ERASE GATE

(71) Applicant: UNITED MICROELECTRONICS CORP., Hsin-Chu City (TW)

(72) Inventors: Yi-Ning Peng, Miaoli County (TW); Hsueh-Chun Hsiao, Hsinchu County (TW); Tzu-Yun Chang, Hsinchu County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 0 days.

(21) Appl. No.: 18/677,836

(22) Filed: May 29, 2024

(65) Prior Publication Data

US 2024/0312527 A1 Sep. 19, 2024

Related U.S. Application Data

(62) Division of application No. 17/151,226, filed on Jan. 18, 2021, now Pat. No. 12,315,571.

(51) Int. Cl.
| | |
|---|---|
| *H10B 41/10* | (2023.01) |
| *G11C 16/08* | (2006.01) |
| *G11C 16/24* | (2006.01) |
| *H10B 41/27* | (2023.01) |
| *H10D 30/68* | (2025.01) |

(52) U.S. Cl.
CPC .............. *G11C 16/24* (2013.01); *G11C 16/08* (2013.01); *H10B 41/10* (2023.02); *H10B 41/27* (2023.02); *H10D 30/681* (2025.01)

(58) Field of Classification Search
CPC ..................... H10B 41/10; H10B 41/00–41/70
See application file for complete search history.

(56) References Cited

U.S. PATENT DOCUMENTS

| | | | |
|---|---|---|---|
| 4,839,705 A | 6/1989 | Tigelaar | |
| 5,021,847 A | 6/1991 | Eitan | |
| 5,554,553 A | 9/1996 | Harari | |
| 5,943,267 A | 8/1999 | Sekariapuram | |
| 8,895,397 B1 * | 11/2014 | Shum ................. | H10D 30/0411 438/279 |
| 2006/0098486 A1 | 5/2006 | Hung | |
| 2006/0154418 A1 * | 7/2006 | Chang ................... | H10B 41/30 438/257 |
| 2007/0235794 A1 | 10/2007 | Yamazaki | |
| 2011/0085382 A1 | 4/2011 | Lee | |
| 2013/0279268 A1 | 10/2013 | Kang | |
| 2015/0279468 A1 | 10/2015 | Lee | |
| 2016/0086969 A1 | 3/2016 | Zhang | |
| 2017/0110469 A1 | 4/2017 | Yi | |

* cited by examiner

*Primary Examiner* — Kevin Parendo
(74) *Attorney, Agent, or Firm* — Winston Hsu

(57) ABSTRACT
A method for forming semiconductor structure with wave shaped erase gate, the method including the steps: forming a floating gate having staggered islands on a substrate, forming a erase gate having a wave shape on the substrate at a first side of the floating gate, and forming a word line having the wave shape on the substrate at a second side of the floating gate opposite to the first side.

7 Claims, 6 Drawing Sheets

METHOD FOR FORMING SEMICONDUCTOR STRUCTURE WITH WAVE SHAPED ERASE GATE

CROSS REFERENCE TO RELATED APPLICATIONS

This application is a division of U.S. application Ser. No. 17/151,226, filed on Jan. 18, 2021. The content of the application is incorporated herein by reference.

BACKGROUND OF THE INVENTION

1. Field of the Invention

The present invention relates generally to an array of memory cells and forming method thereof, and more specifically to an array of electrically erasable programmable read only memory (EEPROM) and forming method thereof.

2. Description of the Prior Art

An electrically programmable read only memory (EPROM) utilizes a floating (unconnected) conductive gate, in a field effect transistor structure, positioned over but insulated from a channel region in a semi-conductor substrate, between source and drain regions. A control gate is then provided over the floating gate, but also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate. A transistor is programmed to one of two states by accelerating electrons from the substrate channel region, through a thin gate dielectric and onto the floating gate.

The memory cell transistor's state is read by placing an operating voltage across its source and drain and on its control gate, and then detecting the level of current flowing between the source and drain as to whether the device is programmed to be "on" or "off" at the control gate voltage selected.

SUMMARY OF THE INVENTION

The present invention provides an array of electrically erasable programmable read only memory (EEPROM) and forming method thereof, which forms rows of floating gates having staggered islands to reduce the cross talk capacitance and keep the macro size of the array of erasably programmable read only memory cells.

The present invention provides an array of electrically erasable programmable read only memory (EEPROM) including a substrate, isolation structures, a row of erase gate and a row of floating gates. The isolation structures are defined in the substrate to extend in a first direction. The row of erase gate having a wave shape is disposed across the substrate. The row of floating gates having staggered islands is disposed parallel to the row of erase gate.

The present invention provides a method of forming an array of electrically erasable programmable read only memory (EEPROM) including the following steps. A row of floating gates having staggered islands is formed on a substrate. A row of erase gate having a wave shape is formed on the substrate at a first side of the row of floating gates. A row of word line having the wave shape is formed on the substrate at a second side of the row of floating gates opposite to the first side.

According to the above, the present invention provides an array of electrically erasable programmable read only memory (EEPROM) and forming method thereof, which includes a row of erase gate having a wave shape disposed across substrate, a row of floating gates having staggered islands disposed parallel to the row of erase gate, and a row of word line having the wave shape disposed parallel to the row of erase gate and at a side of the row of floating gates opposite to the row of erase gate. By doing this, the spacings of the adjacent floating gates of the row of floating gates increase. This reduces the cross talk capacitance, and there is no impact on the macro size of the array of erasably programmble read only memory cells.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
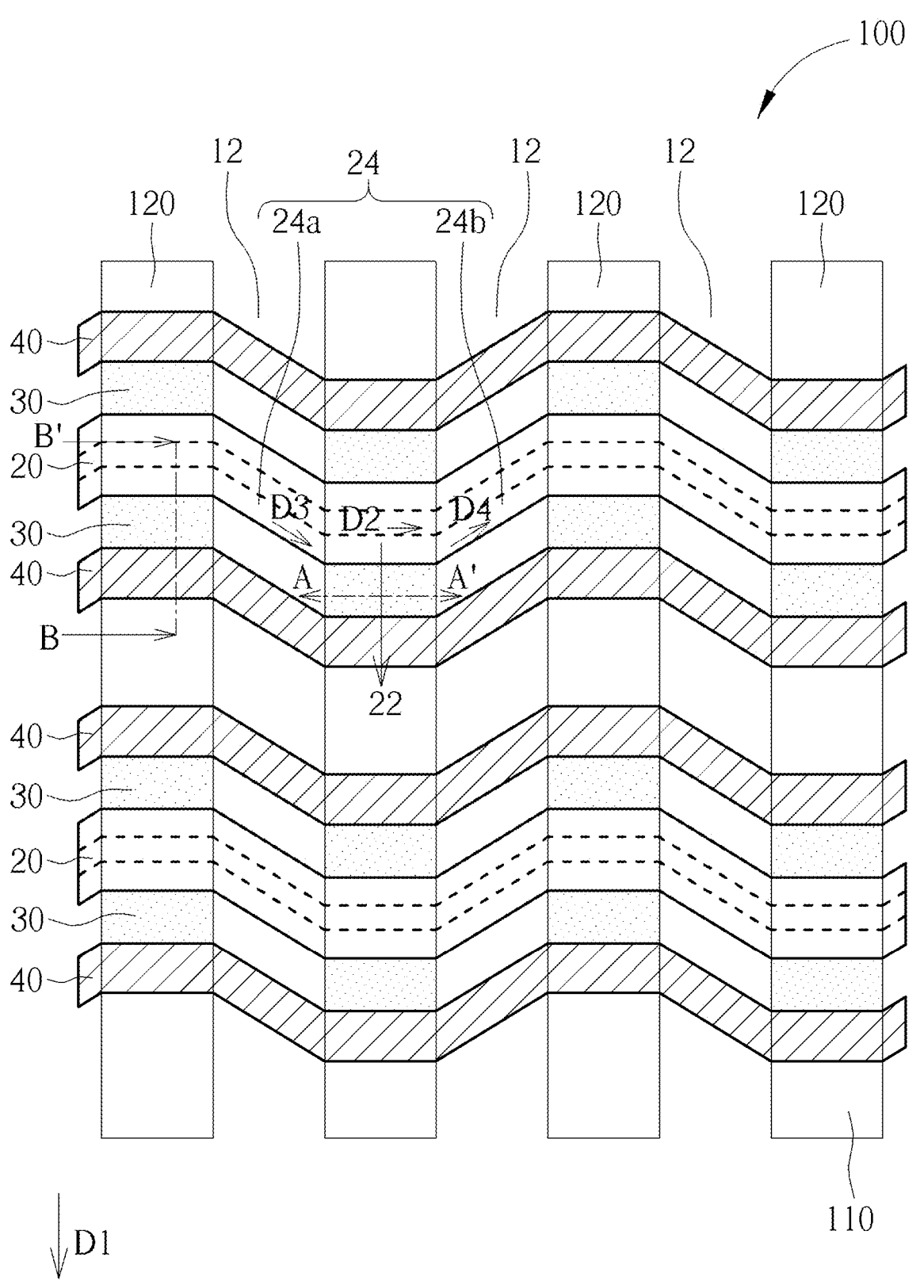
FIG. 1 schematically depicts a top view of an array of electrically erasable programmable read only memory (EEPROM) according to an embodiment of the present invention.

FIG.1 schematically depicts a top view of an array of electrically erasable programmable read only memory (EE- PROM) according to an embodiment of the present invention. As shown in FIG.1, a substrate 110 (120) is provided. Isolation structures 12 are defined in the substrate 110, wherein the isolation structures 12 extend in a first direction DI. Rows of erase gates 20 are disposed across the substrate bit lines-120. In this present invention, the rows of erase gates 20 have wave shapes.

Figure 2:
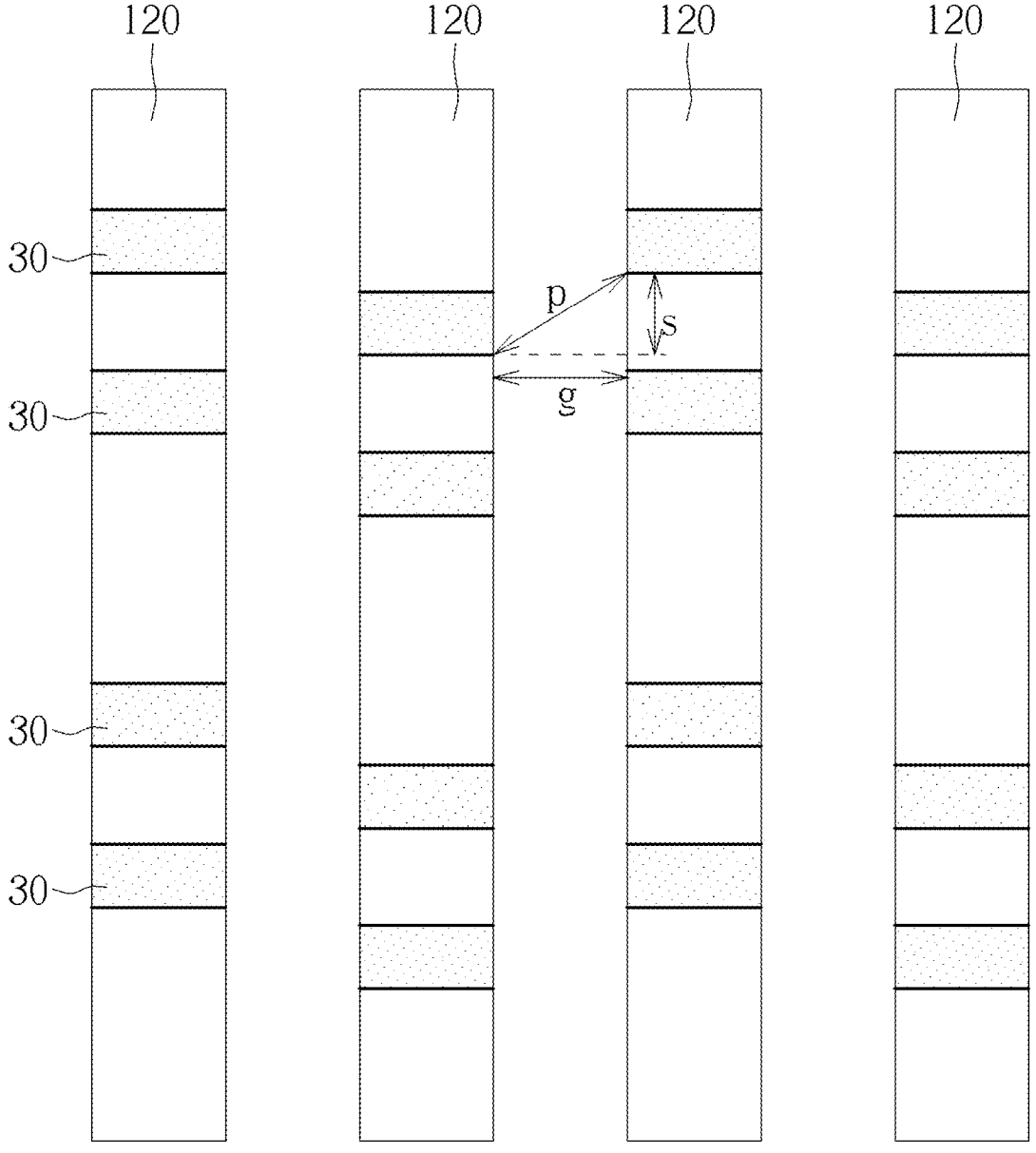
FIG. 2 schematically depicts a top view of rows of floating gates according to an embodiment of the present invention.

Rows of floating gates 30 are disposed parallel to the row of erase gate 20, but the row of floating gates 30 are only disposed on and vertically overlap the substrate 120, and therefore the row of floating gates 30 are staggered islands. FIG.2 schematically depicts a top view of rows of floating gates according to an embodiment of the present invention. The rows of floating gates 30 are staggered islands, and vertically overlap the substrate 120 completely. The adjacent floating gates of the rows of floating gates 30 are dislocated. Therefore, the spacings P of the adjacent floating gates of the rows of floating gates 30 increase, and thus the cross talk capacitance is reduced, and there is no impact on the macro size of the array of erasably programmble read only memory cells 100. In a preferred embodiment, a ratio of a gap g between the adjacent floating gates and a shifting s between the adjacent floating gates is 63: 45~45:63, thereby the cross talk capacitance can being reduced more than 20% while the macro size of the array of erasably programmble read only memory cells 100 only increases less than 0.4%.

Please refer to FIG. 1, rows of word lines 40 are also disposed parallel to the rows of erase gates 20 and at sides of the row of floating gates 30 opposite to the rows of erase gates 20, wherein the rows of word lines 40 have the wave shapes common to the wave shapes of the rows of erase gates 20 in a preferred embodiment to improve the layout of the array of erasably programmable read only memory cells 100. In this embodiment, there is no control gate disposed in the array of electrically erasable programmable read only memory (EEPROM).

The rows of erase gates 20 have the wave shapes constituted by first parts 22 and second parts 24. The first parts 22 connect to the second parts 24, and the first parts 22 and the second parts 24 are alternatively arranged. The first parts 22 overlap the substrate 120 completely, and the second parts 24 are disposed between the substrate 120. Furthermore, the second parts 24 may include second-one parts 24a and second-two parts 24b, wherein the second-one parts 24a and the second-two parts 24b connect to the first parts 22 alternatively. In this embodiment, the second-one parts 24a and the second-two parts 24b extend along different directions to constitute the wave shapes of the rows of erase gates 20. Hence, the adjacent first parts 22 are also dislocated and are distributed right next to the adjacent floating gates of the rows of floating gates 30.

More precisely, the first parts 22 extend along a second direction D2, the second-one parts 24a extend along a third direction D3 and the second-two parts 24b extend along a fourth direction D4. In a preferred embodiment, the second direction D2 is orthogonal to the first direction D1, and the third direction D3 and the fourth direction D4 have common absolute values of slope for improving the layout and the macro size of the array of erasably programmable read only memory cells 100.

Figure 3:
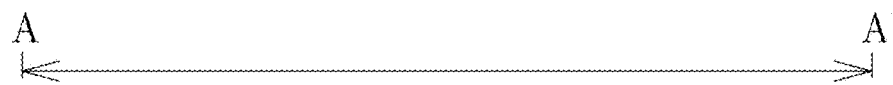
FIG. 3 schematically depicts a cross-sectional view of a method of forming an array of electrically erasable programmable read only memory (EEPROM) according to an embodiment of the present invention.
Figure 3:
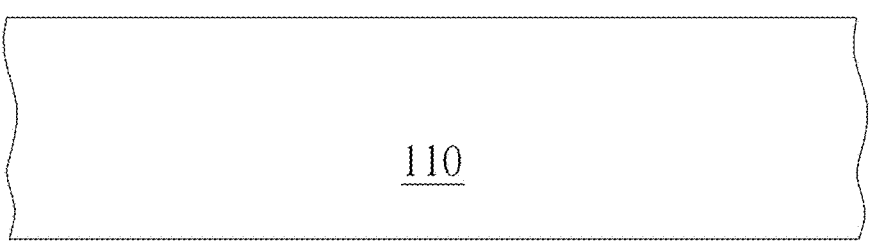
Figure 4:
FIG. 4 schematically depicts a cross-sectional view of a method of forming an array of electrically erasable programmable read only memory (EEPROM) according to an embodiment of the present invention.
Figure 4:
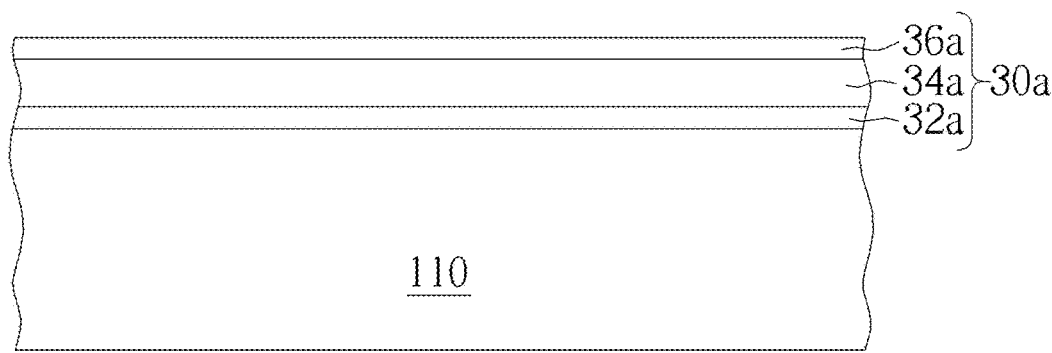
Figure 5:
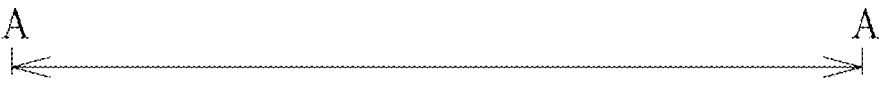
FIG. 5 schematically depicts a cross-sectional view of a method of forming an array of electrically erasable programmable read only memory (EEPROM) according to an embodiment of the present invention.
Figure 5:
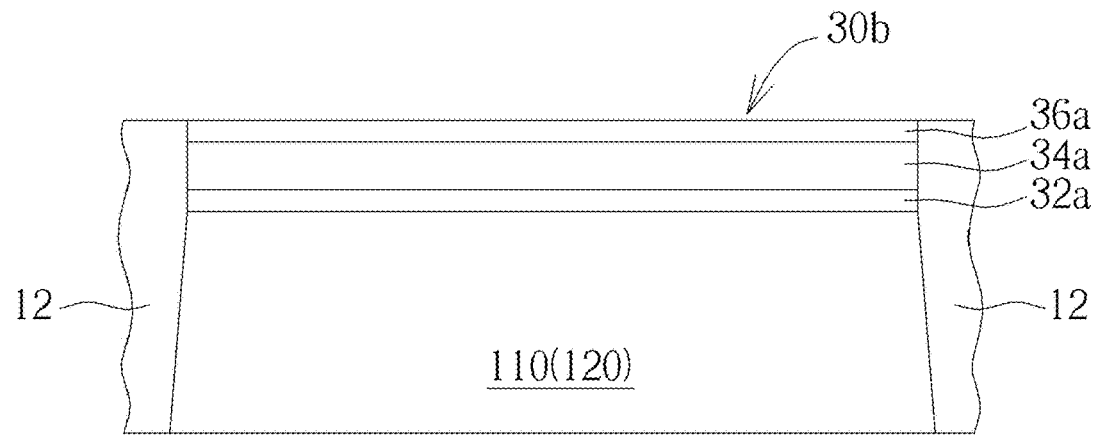

A method of forming said array of electrically erasable programmable read only memory (EEPROM) 100 is presented as follows. FIG. 3-10 schematically depict cross-sectional views of a method of forming an array of electrically erasable programmable read only memory (EEPROM) according to an embodiment of the present invention for illustrating the present invention, wherein same symbols of FIGS. 3-10 represent same components corresponding to FIGS. 1-2. FIGS. 3-5 are the cross-sectional views along line AA' of FIG. 1, and FIGS. 6-10 are the cross-sectional views along line BB' of FIG. 1.

Figure 6:
FIG. 6 schematically depicts a cross-sectional view of a method of forming an array of electrically erasable programmable read only memory (EEPROM) according to an embodiment of the present invention.
Figure 6:
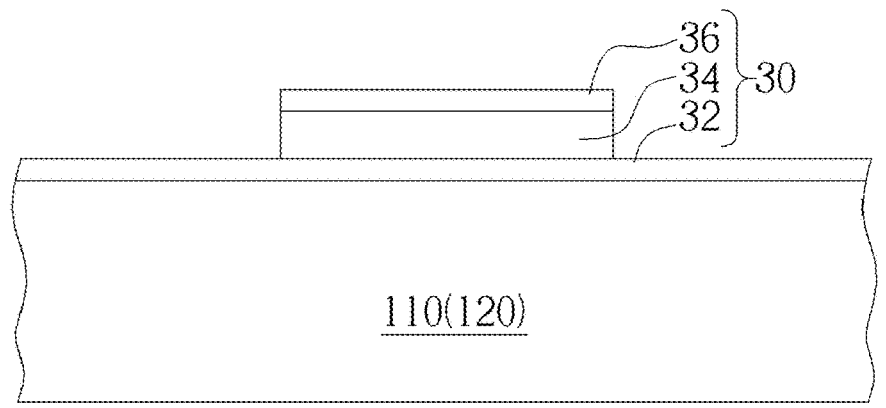

Please refer to FIG. 3, which is the cross-sectional view along the line AA' of FIG.1, the substrate 110 is provided. The substrate is a silicon substrate in this embodiment. Please refer to FIGS. 4-6, the row of floating gates 30 having staggered islands are formed on the substrate 110. The row of floating gates 30 include an ONO layer (silicon oxide/silicon nitride/silicon oxide layer) 32, a polysilicon layer 34 and a cap layer 36 stacked from bottom to top, but it is not limited thereto. As shown in FIG.4, which is the cross-sectional view along the line AA' of FIG.1, a floating gate film stack 30a is deposited on the substrate 110 blanketly, wherein the floating gate film stack 30a may include an ONO layer 32a, a polysilicon layer 34a and a cap layer 36a, but it is not limited thereto. As shown in FIG.5, the isolation structures 12 are formed in the substrate 110 (120), and therefore the substrate 110 (120) is sandwiched by the isolation structures 12, and a floating gate film stack 30b covering the substrate bit lines-120 and sandwiched by the isolation structures 12 is also formed. As shown in FIG.6, which is the cross-sectional view along the line BB' of FIG.1, the floating gate film stack 30b is patterned to form the row of floating gates 30 having staggered islands.

Figure 7:
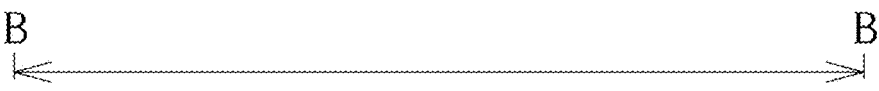
FIG. 7 schematically depicts a cross-sectional view of a method of forming an array of electrically erasable programmable read only memory (EEPROM) according to an embodiment of the present invention.
Figure 7:
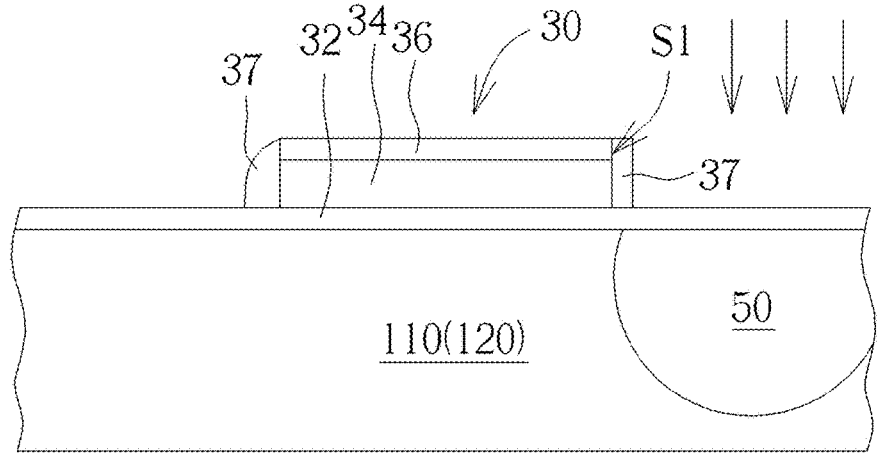

As shown in FIG. 7, which is the cross-sectional view along the line BB' of FIG. 1, spacers 37 are formed beside the row of floating gates 30. A source line 50 is implanted in the substrate 110 beside a side S1 of the row of floating gates 30.

Figure 8:
FIG. 8 schematically depicts a cross-sectional view of a method of forming an array of electrically erasable programmable read only memory (EEPROM) according to an embodiment of the present invention.
Figure 8:
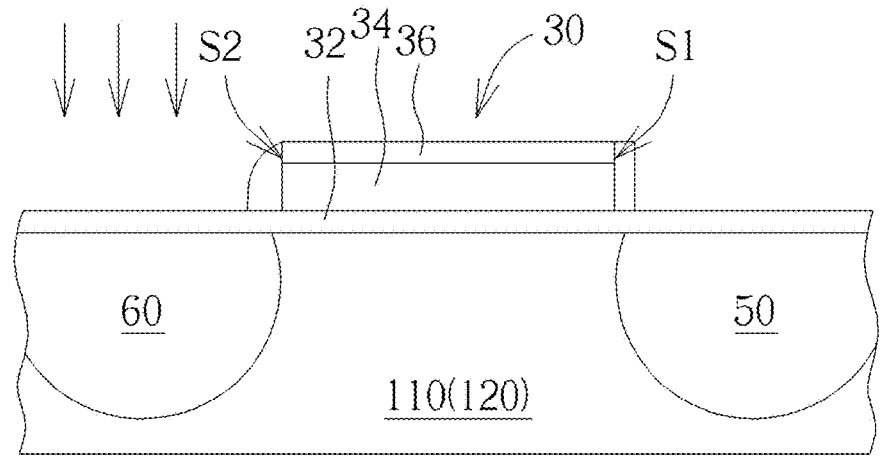

As shown in FIG. 8, which is the cross-sectional view along the line BB' of FIG. 1, a word line well 60 is doped in the substrate 110 at a side S2 of the row of floating gates 30.

Figure 9:
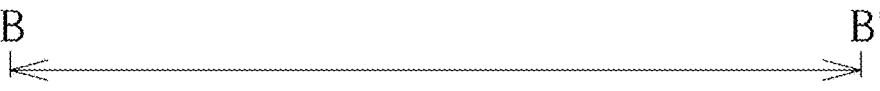
FIG. 9 schematically depicts a cross-sectional view of a method of forming an array of electrically erasable programmable read only memory (EEPROM) according to an embodiment of the present invention.
Figure 9:
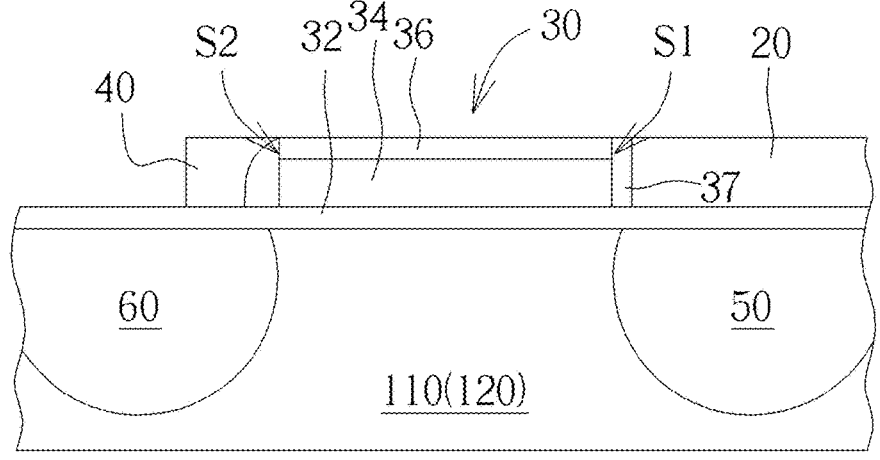

As shown in FIG. 9, which is the cross-sectional view along the line BB' of FIG. 1, the row of erase gate 20 having the wave shape is formed on the substrate 110 at the side S1 of the row of floating gates 30, and the row of word line 40 having the wave shape is formed on the substrate 110 at the side S2 of the row of floating gate 30 opposite to the side S1. In this case, the row of erase gate 20 and the row of word line 40 are formed at a same time, but the present invention is not restricted thereto. Thus, the source line 50 is located right below the row of erase gate 20.

Figure 10:
FIG. 10 schematically depicts a cross-sectional view of a method of forming an array of electrically erasable programmable read only memory (EEPROM) according to an embodiment of the present invention.
Figure 10:
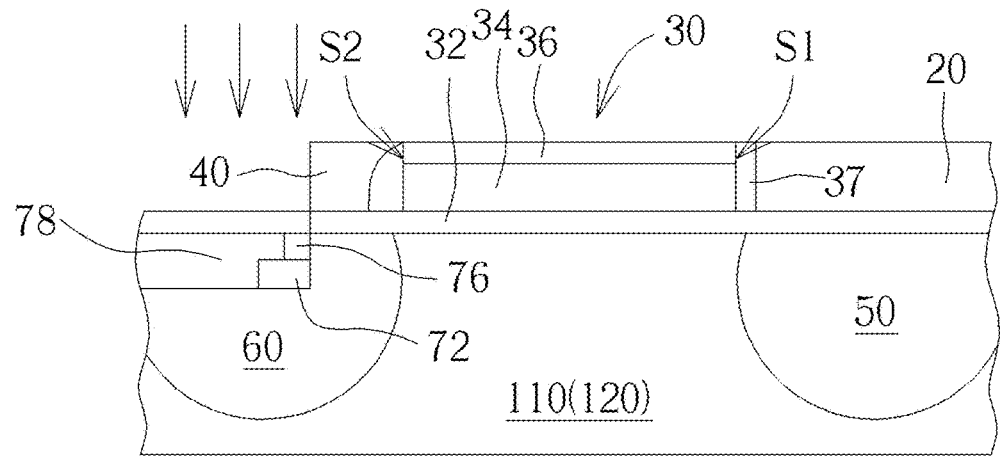

As shown in FIG. 10, which is the cross-sectional view along the line BB' of FIG. 1, a halo implantation region 72 and a lightly doped region 76 are formed in the word line well 60 beside the row of word line 40 and a heavily doped region 78 is formed in the lightly doped region 76 beside the row of word line 40. Above all, methods of forming said components are well known in the art, and are not described.

To summarize, the present invention provides an array of electrically erasable programmable read only memory (EEPROM) and forming method thereof, which includes isolation structures defined in a substrate, a row of erase gate having a wave shape disposed across the substrate, a row of floating gates having staggered islands disposed parallel to the row of erase gate, and a row of word line having the wave shape disposed parallel to the row of erase gate and at a side of the row of floating gates opposite to the row of erase gate. By doing this, floating gates of the row of floating gates are dislocated and thus the spacings of the adjacent floating gates of the rows of floating gates increase. Hence, the cross talk capacitance is reduced, and there is no impact on the macro size of the array of erasably programmble read only memory cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure with wave shaped erase gate, comprising:

forming a plurality of floating gates having staggered islands on a substrate;

forming an erase gate having a wave shape on the substrate at a first side of one of the floating gates, wherein the wave shape has first parts connecting to second-one parts and second-two parts, wherein the first parts, the second-one parts and the second-two parts are alternatively arranged, wherein the first parts extend along a second direction, the second-one parts extend along a third direction and the second-two parts extend along a fourth direction, and wherein the third direction and the fourth direction are not orthogonal to the second direction; and forming a word line having the wave shape on the substrate at a second side of one of the floating gates opposite to the first side; and forming a word line well in the substrate at the second side before the word line is formed.

2. The method of forming a semiconductor structure with wave shaped erase gate according to claim 1, further comprising:

forming a source line in the substrate beside one of the floating gates before the erase gate is formed.

3. The method of forming a semiconductor structure with wave shaped erase gate according to claim 1, wherein the word line and the erase gate are formed at the same time.

4. The method of forming a semiconductor structure with wave shaped erase gate according to claim 1, further comprising:

forming lightly doped regions beside the word line after the word line is formed.

5. The method of forming a semiconductor structure with wave shaped erase gate according to claim 1, wherein the erase gate has the wave shape when viewed from a top view.

6. The method of forming a semiconductor structure with wave shaped erase gate according to claim 1, wherein the second direction is orthogonal to a first direction, wherein a plurality of isolation structures are defined in the substrate to extend in the first direction.

7. The method of forming a semiconductor structure with wave shaped erase gate according to claim 1, wherein two of the first parts adjacent to each other are not aligned with each other along the second direction.

* * * * *